(12) United States Patent
Yeung et al.

(10) Patent No.: US 7,989,951 B2
(45) Date of Patent: Aug. 2, 2011

(54) DIE ASSEMBLIES

(75) Inventors: Betty H. Yeung, Chandler, AZ (US); David J. Dougherty, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/704,941

(22) Filed: Feb. 12, 2010

(65) Prior Publication Data

US 2010/0142168 A1 Jun. 10, 2010

Related U.S. Application Data (62) Division of application No. 11/341,991, filed on Jan. 27, 2006, now abandoned.

(51) Int. Cl.
H01L 23/12 (2006.01)
(52) U.S. Cl. ............ 257/732; 257/E23.026; 257/710; 257/728; 438/122; 174/521
(58) Field of Classification Search ........... 257/E23.026, 257/E25.016, 202, 706, 709, 703, 732, 787, 257/659, 664, 710, 712, 675, 728, 718, 719; 174/521, 528, 550, 551; 438/122, 123; 361/760, 361/712, 719
See application file for complete search history.

(56) References Cited

U.S. PATENT DOCUMENTS

| | | | | |
|---|---|---|---|---|
| 3,784,884 A * | 1/1974 | Zoroglu | ......................... | 257/664 |
| 4,067,040 A * | 1/1978 | Tsuzuki et al. | ............... | 257/705 |
| 4,651,192 A | 3/1987 | Matsushita et al. | | |
| 4,672,417 A * | 6/1987 | Sugiyama et al. | ............ | 257/746 |
| 4,985,753 A | 1/1991 | Fujioka et al. | | |
| 4,994,897 A | 2/1991 | Golubic et al. | | |
| 5,055,911 A * | 10/1991 | Ogata | ........................... | 257/711 |
| 5,087,964 A | 2/1992 | Hatta | | |
| 5,309,014 A * | 5/1994 | Wilson | ........................ | 257/584 |
| 5,877,555 A | 3/1999 | Leighton et al. | | |
| 6,056,186 A * | 5/2000 | Dickson et al. | ............ | 228/122.1 |
| 6,211,463 B1 | 4/2001 | Fabis | | |
| 6,261,868 B1 | 7/2001 | Miller et al. | | |
| 6,335,863 B1 | 1/2002 | Yamamoto et al. | | |
| 6,462,413 B1 | 10/2002 | Polese et al. | | |
| 7,298,046 B2 | 11/2007 | Venegas et al. | | |
| 7,445,967 B2 * | 11/2008 | Abdo et al. | ................... | 438/123 |
| 2002/0025606 A1 | 2/2002 | Kurihara et al. | | |
| 2003/0038362 A1 | 2/2003 | Nomura | | |
| 2004/0046247 A1 * | 3/2004 | Tower | .......................... | 257/708 |
| 2004/0184239 A1 | 9/2004 | Zimmerman | | |
| 2004/0246682 A1 * | 12/2004 | Osakada et al. | ............. | 361/709 |
| 2005/0012080 A1 | 1/2005 | Zimmerman | | |
| 2005/0012118 A1 | 1/2005 | Zimmerman | | |
| 2005/0016750 A1 | 1/2005 | Zimmerman | | |
| 2005/0191793 A1 * | 9/2005 | Brennan et al. | ............... | 438/125 |

* cited by examiner

Primary Examiner — Chris Chu
(74) Attorney, Agent, or Firm — Ingrassia Fisher & Lorenz, P.C.

(57) ABSTRACT

An embodiment of a die assembly includes a flange, lip walls, and leads for electrical contact with one or more die mounted on the flange. The flange has first and second opposed flange surfaces and flange sidewalls extending between the surfaces. The lip walls have first and second opposed lip surfaces and lip sidewalls extending between the first and second lip surfaces. The lip sidewalls are positioned adjacent to the flange sidewalls. The leads, which have inboard end portions and outboard end portions, are configured to preserve a seating plane. The seating plane is spaced apart from a plane of the second flange surface. The inboard end portions of the leads are embedded in the lip walls, and extend from the seating plane upward through the lip walls toward the first lip surfaces. The outboard end portions are aligned substantially within the seating plane.

20 Claims, 6 Drawing Sheets

DIE ASSEMBLIES

RELATED APPLICATION

This application is a divisional of co-pending application Ser. No. 11/341,991, filed on Jan. 27, 2006.

TECHNICAL FIELD

Embodiments of the present invention relate generally to semiconductor device fabrication. More particularly, embodiments relate to semiconductor packaging for reduction of thermal-mechanical deformation of a flange known as "warpage."

BACKGROUND

It is well known that after semiconductor dies are fabricated on a semiconductor wafer, such as but not limited to, silicon or gallium arsenide, the wafer is sawn (also referred to as "diced") to separate the individual semiconductor die (also known as "dice" or "chips" or "device") on the wafer. These separated die are then each packaged to facilitate safe die handling, and attachment to circuit boards, heat sinks, and the like. During this process, the die is attached or mounted to a packaging substrate (also known as a "flange"). In the case of some devices, such as power amplifiers, where heat generation is expected during operation of the device, the die with packaging substrate backing is then mounted or attached to a heat sink that acts to remove generated heat by conduction away from the device in use.

In a typical packaging process, the die is attached to the flange by any suitable method, for example by soldering or using an adhesive. This process is carried out at elevated temperature, and the die-flange combination is subsequently cooled to room temperature.

For conventional materials used in packaging, such as those described in U.S. patent publication 20050016750 A1, there is a tendency for the flange to deform from planarity or "warp," upon cooling after the die attachment process. The deformation leads to further manufacturing problems in subsequent processes when the window frame, leads and lid are attached. It also to leads to inefficient transfer of heat generated by the die, while it is in use, to the flange and heat sink. Consequently, the warpage prevents the maximum potential heat transfer from die to flange and from flange to heat sink. This leads to temperature increase at the die, with undesirable consequences.

In another configuration, U.S. patent publication 20050012118 describes a package that can withstand high die-attach temperatures and that can provide a hermetically sealed air cavity for a die, without the use of adhesives. It discusses a circuit package for housing semiconductor that has a metallic flange, one or more high-copper leads and a liquid crystal polymer frame molded to the flange and the leads. The flange includes a dovetail-shaped groove that mechanically interlocks with the molded frame. During molding, a portion of the frame forms a key that freezes in or around the frame retention feature. There is no discussion of heat-induced flange deformation.

The art recognizes that heat transfer from die to flange poses a challenge in operations where the die is attached at high temperature, and the combination is subsequently cooled to room temperature and thermal-mechanical deformation is induced.

Accordingly, it is desirable to minimize the warpage of the flange in the die attachment process. In addition, it is desirable to develop a solution that retains the highest possible heat transfer from die to flange, and from flange to heat sink. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the various embodiments may be derived by referring to the detailed description and claims when considered in conjunction with the following figures, which are not represented as being to scale, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, or the following detailed description. In addition, for the sake of brevity, conventional techniques related to finite element analysis, finite difference analysis, and thermal modeling may not be described in detail herein.

In a package designed to remove heat from an operating device, like a power amplifier, the main mechanism for heat transfer from the die to the package substrate (also known as the "flange") to which it is attached directly, is by conduction. Heat transfer by conduction is dependent, among other parameters, upon the surface area of the die that is in direct contact with the flange. All other factors being equal, heat transfer increases as contact area increases. Accordingly, complete physical contact over the entire interfacial area between die and flange maximizes heat transfer by conduction.

A predominant cause of loss of heat transfer efficiency from a die to the flange is physical deformation or "warpage" of the flange leading to separation between the die and the flange along their interface. The warpage often arises during the die attachment process, which is carried out at elevated temperatures. For some packaging materials used in standard packaging the warpage can be in excess of 5 mils. The extent of warpage varies, based on several factors (die attachment temperature, flange thickness, number of die attached, semiconductor and packaging material properties, etc.) but can be significant. Excessive warpage has undesirable effects in fabrication as well as subsequent use of the device. Thus, for example, warpage must be minimized to avoid deleterious effects on subsequent assembly operations that must be performed on the package. In addition, the physical separation between die and flange results in a gap that, whether air-filled or not, disrupts heat transfer by conduction from die to flange (which then transfer heat to the heat sink). The gap reduces the area of the die in direct contact with the flange and thereby reduces conductive heat transfer.

Heat transfer rates from die to flange can be maintained by preventing or minimizing the extent of flange warpage that causes separation during die attachment processes. Warpage can be reduced to some extent by appropriate selection of materials. For example, flange materials may be selected from those that have a coefficient of thermal expansion ("CTE") that closely approximates or more closely matches the CTE of the die. This selection will avoid or minimize the build up of thermally-induced mechanical stresses at the die-flange interface that may cause physical separation of die and flange along at least a part of the interface. However, those materials that have a CTE that closely approximates the CTE of the die tend to have poor thermal conductivity ("TC") properties. A high TC is essential for high rates of heat transfer from die to flange and then through the flange to the heat sink. This means that a flange material with a poor TC may allow the die temperature to rise (because of inability to conduct heat away) and the temperature may reach a point that could result in adverse performance, diminished reliability, or even die damage.

Accordingly, the invention provides modified flanges that have physical features to reduce the tendency of the flange to warp under thermally induced stresses, and that reduces the tendency for separation at the interface between the flange and the die.

More particularly, in one embodiment, the invention provides a packaging substrate base (also known as a "flange") that has a structural lip configured to impart "stiffness" to the substrate base. The term "stiffness" here means the degree of resistance to thermally-induced warpage, where the warpage results from attachment of die to a flange that has a different coefficient of thermal expansion from the die.

The flange-stiffening lip may be made from a variety of materials but commonly would be the same as the flange body. The flange may be made of a conductive material such as copper-tungsten, copper-molybdenum, copper, and high conductivity ceramics. The stiffness of the raised lip is achieved through appropriate configuration of the lip (height, width and shape) and is sufficient to at least partially counteract the warpage-inducing stresses generated from coefficient of thermal expansion differentials between the flange and a die attached to it. The lip may be molded or otherwise formed with the flange as a unitary lip-stiffened flange, or may be a separate structure that is affixed to the flange. In general, the packaging flange has a first surface that has a first region having the stiffening lip. The first surface also has a second region for die attachment. The second region is a region that is stiffened by the lip, and may be raised above the first surface of the flange. The second region may be in the form of a single pedestal supporting a single or multiple die, or may be a series of raised pedestals, each supporting one or more die.

In another embodiment, the invention provides an assembly of die on the lip-stiffened flange. In addition to the flange, the assembly also includes at least one die in the second region of the flange. To facilitate electrical communication, the assembly includes leads for electrical contact with the die. The leads and flange are insulated from each other by means of an intermediate material, such as a (non-conductive) ceramic layer, interposed between the flange and the leads. In one embodiment, the leads are configured to preserve a seating plane at the desired height and configuration. The leads may be embedded in an organic composition. Further, the leads may have an end-portion embedded in and extending along a length of the lip; or the lead end portions may be attached along an upper surface of a length of the lip.

The stiffening lip may take any of a variety of suitable shapes. In one embodiment, the lip is a raised wall that extends around a peripheral area of the flange. Taking into account that the flange is laterally divided in the accompanying drawings, the lip is shown U-shaped, but should be understood to include its mirror image to form a frame-shape. Other raised configurations that also provide resistance to heat-induced stress deformation of the flange are, of course, also useful and contemplated in the invention. For example, the lip may be in the shape of a rectangular array of a pair of spaced apart longitudinal and a pair of spaced apart lateral rails, where the rails are not connected up to form a frame. Or the stiffening features could be a series of longitudinally extending rails, such as two or three or more parallel rails.

It is useful to consider the prior art before turning to details of embodiments of the invention depicted in the accompanying figures. In referring to the attached figures showing flanges of the invention and prior art flanges, it should be noted that the flanges are symmetrical about a lateral axis at their mid points. Each depicted flange has been cut in half laterally at the midpoint, so that only one half is shown, for simplicity.

Figure 1:
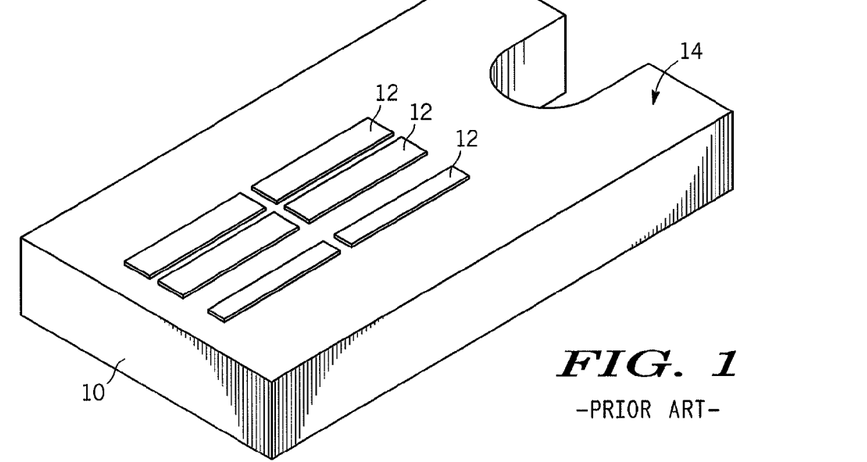
FIG. 1 is a schematic depiction of half of a prior art air cavity package.

Referring now to FIG. 1, which is half of a symmetrical device obtained by cutting it laterally across a plane of symmetry, a flange 10 is a planar substantially rectangular block of appropriate conductive material such as copper, to which are attached die 12, which may be, but are not limited to, semiconductor devices of silicon. In this particular case there are six die arrayed in two rows of three each (i.e. twelve in the entire package). Note that upper surface 14 of the flange 10 is planar and devoid of raised features.

Figure 2:
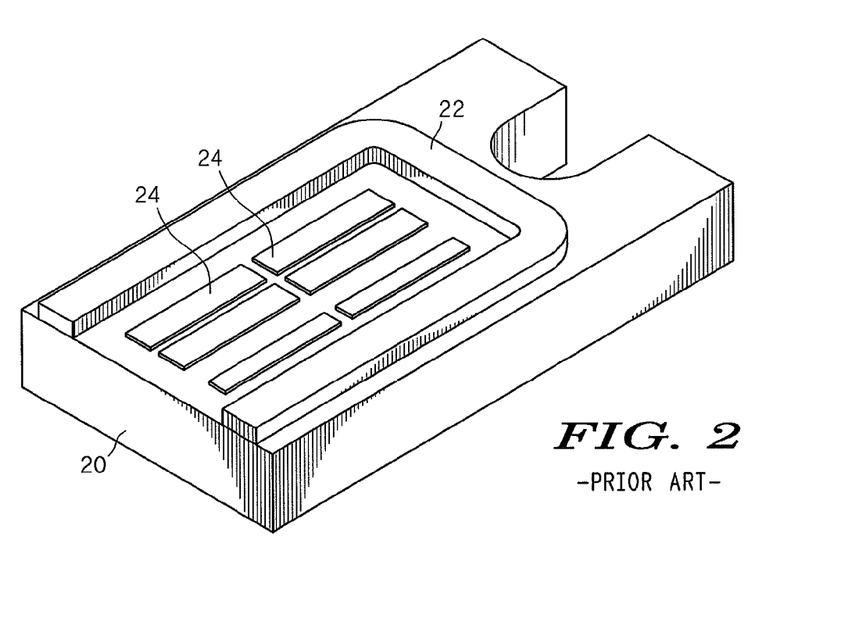
FIG. 2 is a schematic depiction of half of another prior art air cavity package with a bonded ceramic insulator frame.

Referring further to prior art depicted in FIG. 2, also a half of a symmetrical device, the flange 20 is similar to that of FIG. 1, but has an adhered non-conductive ceramic frame 22 extending at the periphery and around a central area of the flange where the die 24 are attached.

Figure 3:
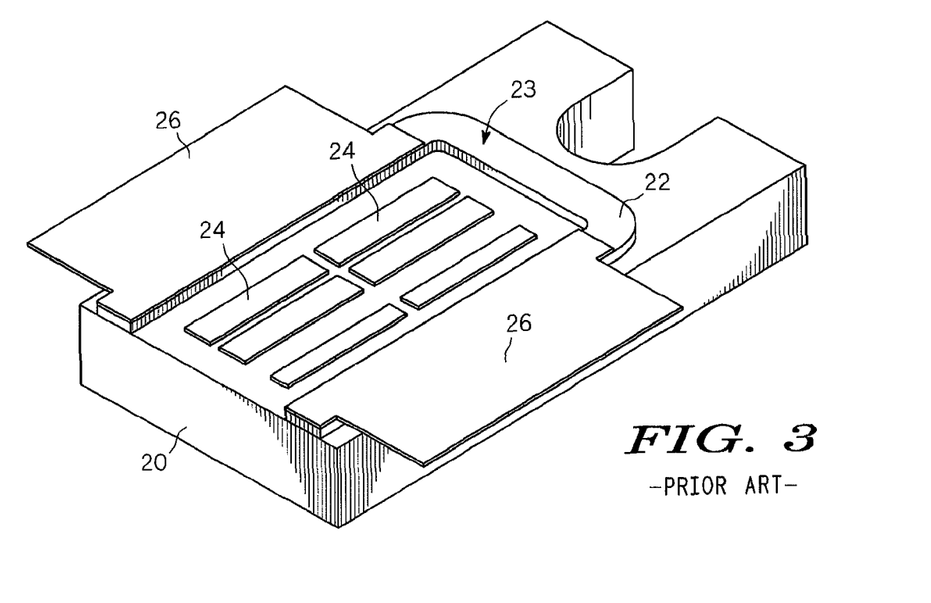
FIG. 3 is a schematic depiction of the half of the prior art assembly product of FIG. 2 with attached leads.

Referring to FIG. 3, the prior art of FIG. 2 is depicted with leads 26 attached to the upper surface 23 of the ceramic frame 22. The leads extend outboard away from the flange at a height and in a plane that defines the "seating plane" for the leads to facilitate subsequent processes involving the leads.

Figure 4:
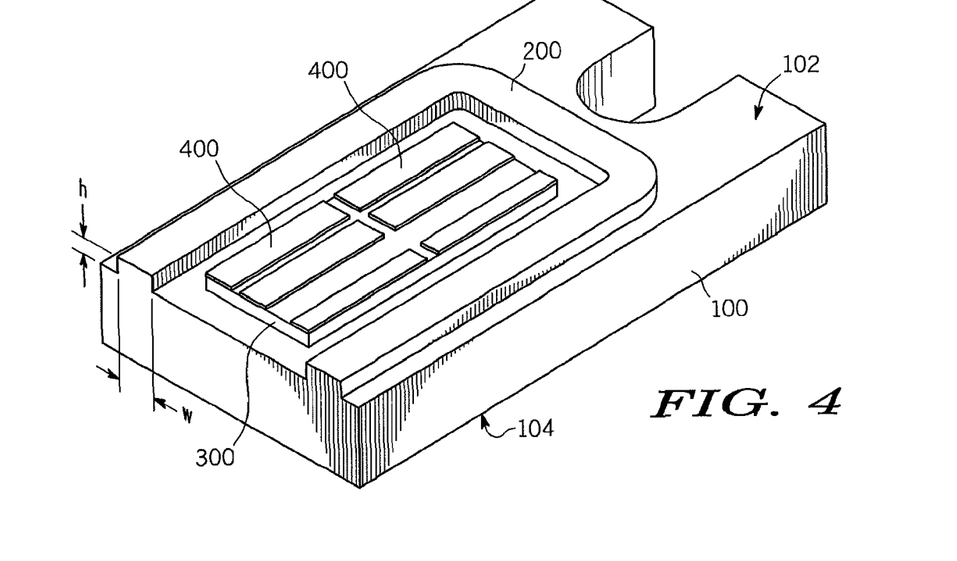
FIG. 4 is a schematic perspective view of half of an embodiment of the invention showing a flange with stiffening lip and die on a die pedestal.

Turning now to embodiments of the invention, FIG. 4 is half of a symmetrical device, cut along a lateral plane of symmetry. FIG. 4 depicts half a flange 100 with an upper surface 102 and an under surface (not shown) 104. A stiffening lip 200 extends along a periphery of the upper surface 102. In this particular embodiment, the lip has a U-shape when halved laterally (i.e. in full shape it is a frame), although other shapes may also be useful and are within the scope of the invention. Also, the lip has a width w and a thickness or height h above surface 102. The height h and width w are selected to enhance stiffness. These dimensions will vary depending upon the size (thickness, length) of the flange and type of flange material, for example. In general however, a greater height h provides more stiffness than a lower height, all other factors being equal. Similarly, a greater width w provides more stiffness to the flange than a lesser width, in general, all other factors being equal. In general, the height h of the lip would be in the range from about 10 to 25 mils for a copper flange. The height h of the lip will vary with materials and geometry of the flange and die, and materials with smaller CTE differences from the die should require smaller h. Smaller h would also be expected for comparatively thicker flanges or when using comparatively thin die, all other factors being equal.

The stiffening lip may be molded with the flange as a one piece unit, or may be subsequently attached to the flange. The stiffening lip may be of the same or different material from the flange. The lip is preferably of the same material as the flange, or of a material with similar CTE. The location and size of the area that is stiffened by the lip also depends upon the configuration and location of the lip. The die may be attached in the stiffened area for best effect.

In FIG. 4, a pedestal 300 is disposed in the lip-stiffened area of the flange 100, and is shown in the form of a raised platform. The raised pedestal 300 provides some enhancement of flange stiffness as well, as shown in the Example provided here below. Die (six die 400 are shown in this example, twelve in the symmetrical device) are attached to the pedestal to take advantage of the stiffened structure in that region that is at least partially surrounded by the stiffening lip 200.

Figure 5:
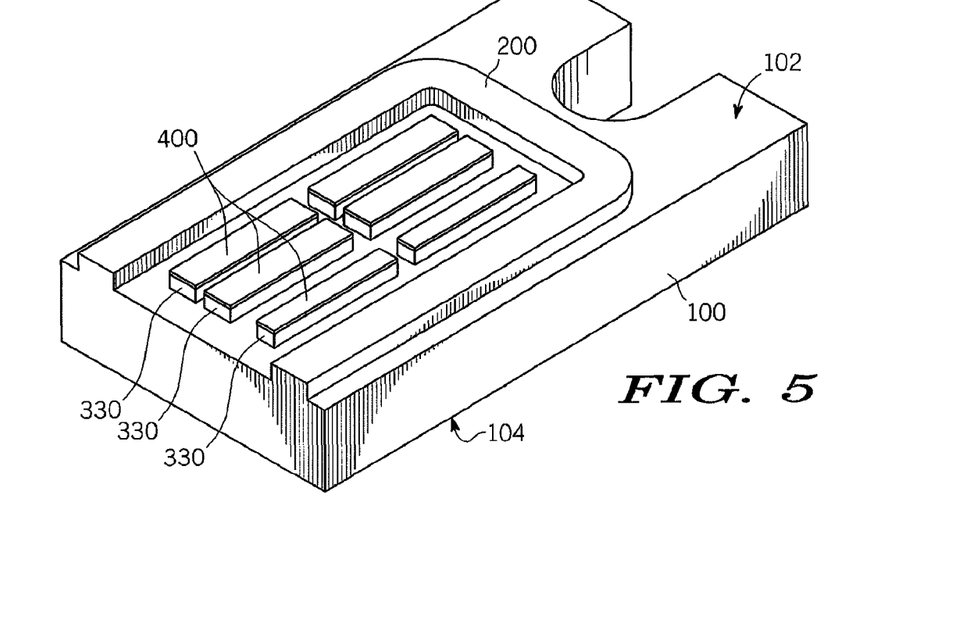
FIG. 5 is a schematic perspective view of half of an embodiment of the invention showing a raised stiffening lip and multiple die, each disposed on its own pedestal.

FIG. 5 depicts another embodiment of the invention, this one also shown in symmetrical half view like that of FIG. 4. However, in this case the pedestal on flange 100 is not a single pedestal but a plurality of raised pedestals 330, each having an upper surface adapted for die attachment. In the embodiment shown the pedestals 330 are sized to conform to and register with the size of the die, however, the pedestals may each be oversized relative to the die. In addition, more than one die may be attached to each pedestal 330, depending upon selected die and pedestal sizes.

Figure 6:
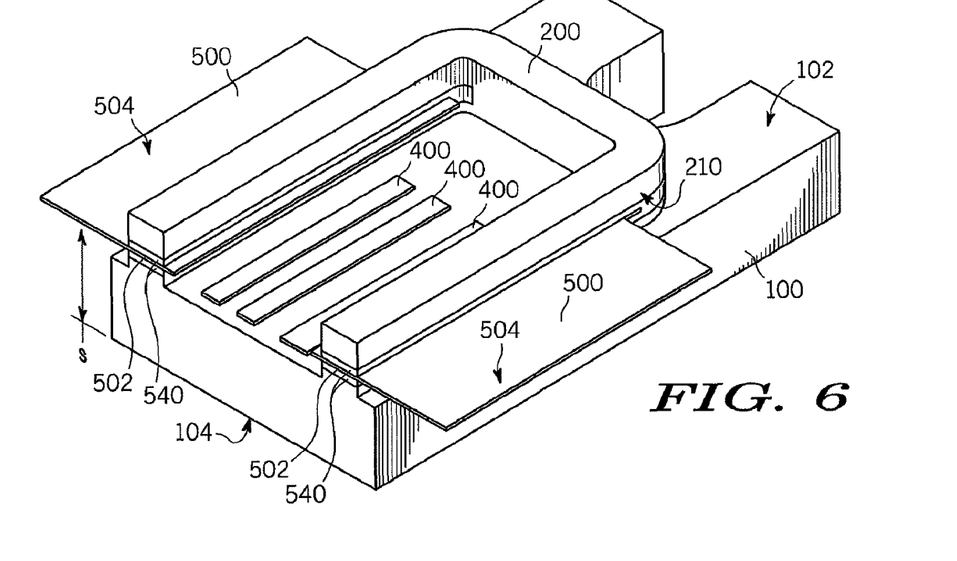
FIG. 6 is a schematic perspective view of half of an embodiment of the invention with embedded leads extending through a molded, stiffening lip.

FIG. 6 is a schematic depiction, according to an embodiment of the invention, of half of a symmetrical product assembly. In this embodiment, the half of the raised lip 200 is of a U-shape (the complete lip is a frame) and disposed to surround die 400 that are disposed on the upper surface 102 of flange 100. The leads 500 have inboard end portions 502 that are embedded into and extend along the length of the wall 210 of the lip 200. Lead end portions 502 are isolated from flange 100 by surrounding non-conductive materials, such as ceramic layers 540, shown. Further the leads 500 are configured so that when end portions 502 are embedded into the lip 200, lead outboard end portions 504 are at a height s (the seating plane) from a plane that is co-extensive with flange under surface 104. Accordingly, very few if any tooling modifications are necessary to accommodate the design for subsequent processing.

Figure 7:
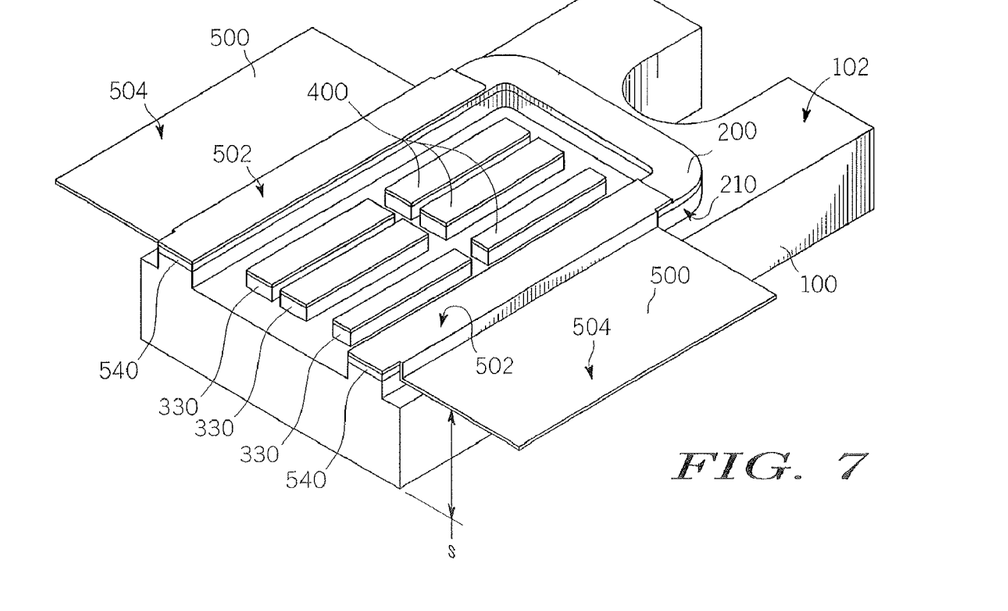
FIG. 7 is a perspective view of half of an embodiment of the invention with embedded leads configured to maintain a standard seating plane and die on multiple pedestals.

FIG. 7 depicts another (lateral symmetrical half of) embodiment of a product assembly of the invention. Here, flange 100 has a stiffening lip 200 and die 400 are each attached to one of a plurality of pedestals 330. Of course, a single raised pedestal with one or a plurality of die attached may also be used. The leads 500 are shaped such that when inboard end portions 502 are attached to the assembly, outboard end portions 504 are in the seating plane s. The inboard end portions 502 of leads 500 are embedded in the proximity of the upper surface of the lip 200 on ceramic inter-layer 540. Alternatively, the lead end portions may be embedded into and extend along the lip wall itself 210, while ensuring electrical isolation from the flange. The leads 500 are shaped so that outboard end portions 504 are at an elevation below the inboard end portions 502 when the leads are attached. End portions 504 will lie in a plane that is a height s (the desired seating plane) above flange undersurface 104, as also shown in FIG. 6.

Figure 8:
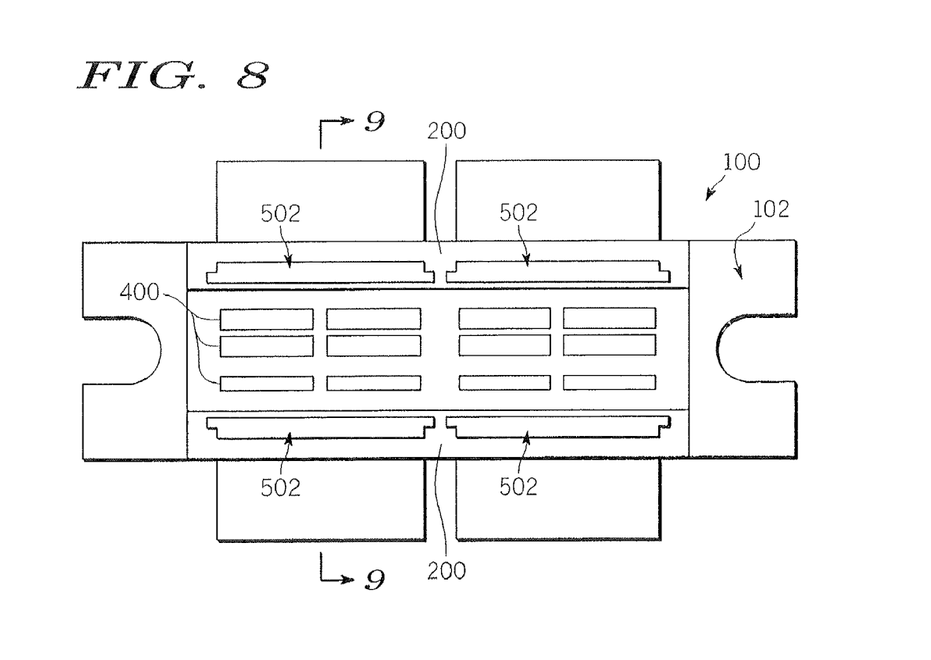
FIG. 8 is a top view of the embodiment of the invention showing a thicker flange with embedded leads, extending through a lip in a peripheral region of the frame, while seating plane s is maintained.
Figure 9:
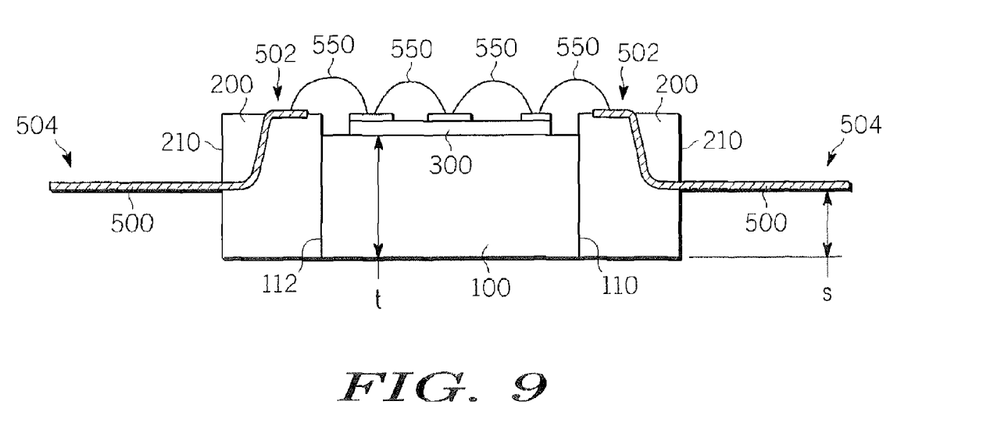
FIG. 9 is a schematic cross sectional view of the embodiment of FIG. 8 with a single pedestal.
Figure 10:
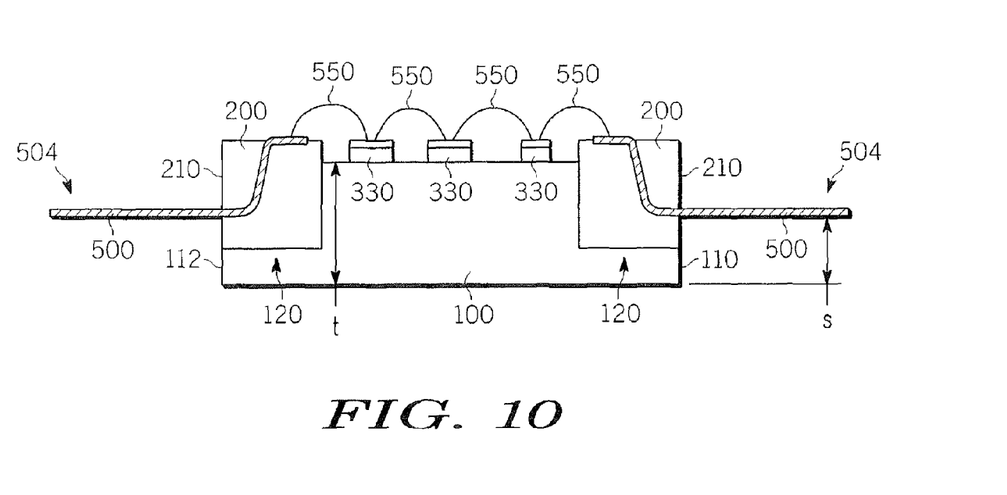
FIG. 10 is an alternative embodiment to FIG. 9 with multiple pedestals.

FIGS. 8, 9 and 10 represent top and alternative cross sectional views, respectively, of embodiments of the invention. Referring first to FIG. 8, a common top view, and FIG. 9, the flange 100 has a raised lip (shown here as a pair of walls 200 extending longitudinally on each side of the flange 100) that stiffens the area between the lip walls 200. A plurality of die 400 is attached in the stiffened area, on a raised platform 300, as seen from FIG. 9. The need for raised platform 300 is discretionary since the flange thickness t could be increased to provide identical stiffness as provided by the coupled system of flange 100 and raised platform 300. From FIGS. 8 and 9, inboard end portions 502 of leads 500 are embedded in opposing lip wall sides 210, and extend upward through the lip walls 210 to be exposed on the upper surface of the lip walls for attachment of connecting leads 550 to die 400. Walls 200 may be of a nonconductive material, such as ceramic or a polymeric material, to ensure isolation of leads 500 from flange 100. In another embodiment, the leads may be isolated electrically from the lip walls 200 by a coating or intermediate layer of a non conductive material. Leads 500 are configured so that outboard end portions 504 are in the desired seating plane s. Clearly, the seating plane s can be adjusted by controlling the shape of leads 500 taking into account the shape of the device and the seating plane necessary.

As shown in FIG. 9, the flange 100 is of greater thickness t than prior art flanges. The thickness t is sufficient to provide resistance to thermally-induced warpage, and is typically in the range from about 65 to 100 mils. The flange 100 has a pair of raised walls 200 that extend around the sides of the flange 100 to form outer side walls 210. The raised walls 200 are penetrated by lead end portions 502 that extend through the walls 200 (all along the length of the walls) to be exposed, for electrical connection, above walls 200 to lead wires 550. These lead wires 550 also connect to the die 400 that are all attached to a single raised pedestal 300. Clearly, each die 400 might also be attached to one of a multiplicity of raised pedestals 330, as shown in FIG. 10. The need for raised pedestal 330 is discretionary since the flange thickness t could be increased to provide identical stiffness as provided by the coupled system of flange 100 and raised platform 330.

The embodiment of FIG. 10 is similar to the embodiment of FIG. 9 except that the raised walls 200 rest upon a platform 120 on the perimeter of the flange 100. Thus, the sides of the device are made up of: (1) upper sidewalls that are the sidewalls 210 of the walls 200; and (2) and lower sidewalls that are the flange sidewalls 110, 112. Leads penetrate the walls 200 as in FIG. 9. Above comments, with reference to FIG. 9, regarding lead electrical isolation from the flange apply here as well.

In general, in one aspect, the invention provides a packaging flange that has a first surface and a second surface opposed to the first. The first surface of the flange includes a first region that has a raised lip extending thereon. The first region is spaced from a second region that is adapted to receive at least one die. The lip is configured to impart stiffness to the flange, the stiffness sufficient to at least partially counteract thermally-induced stresses generated from coefficient of thermal expansion differentials between the flange and a die during an elevated temperature die attachment process. The second region may include a pedestal that has a surface sized and shaped to support at least one die thereon. Or, the second region may include a plurality of pedestals. The lip may extend around a peripheral region of the first surface of the flange to form a frame surrounding the second region. The flange and the lip may be molded in one piece. The ratio of stiffening lip height h to flange thickness t for a configuration like that shown in FIG. 8, using copper flanges, would be in the range from about 0.15 to about 0.25 for a 100 mil thickness flange. The ratio will vary based on several considerations, including flange configuration, materials, and the like.

In another aspect, the invention also provides a die assembly that has a flange having a first surface and a second surface opposed to the first. The first surface of the flange includes a first region having a lip extending thereon. The first region is spaced from a second region that is adapted to receive at least one die. The lip is configured to impart stiffness to the flange, the stiffness sufficient to at least partially counteract thermally-induced stresses generated from coefficient of thermal expansion differentials between the substrate and a die to be mounted thereon in an elevated temperature die attachment process. The flange has at least one die mounted in the second region. The assembly includes leads for electrical contact with the die. The leads may be configured to preserve a seating plane, which is spaced from a plane of the second surface of the flange. In addition, the leads may be embedded in an organic composition, with inboard end-portions embedded in the lip. The leads may be embedded in an organic composition so that the molded leads extend from raised inboard end portions nearest the die to lower outboard end portions that are aligned substantially within the seating plane. The inboard end portions of the leads may be exposed for electrical communication with the die. Further, the second region may include a pedestal having a surface adapted to support at least one die thereon. Or, the second region may have a plurality of pedestals. Each of the pedestals has a surface that may be adapted to support at least one die thereon.

In yet another aspect, the die assembly includes: a packaging flange having a first surface and a second surface opposed to the first, the first surface of the flange comprising a first region having a lip extending thereon, the first region spaced from a second region adapted to receive at least one die, the flange having a body configured to impart stiffness to the flange, the stiffness sufficient to at least partially counteract thermally-induced stresses generated from coefficient of thermal expansion differentials between the flange and a die to be attached thereon during an elevated temperature die attachment process. The body of the flange has thickness in the range from about 65 to about 100 mils. The first region may extend along a side of the flange and the lip may extend upward as a wall above the upper surface of the flange. The first region may alternatively extend along a side of the flange, where the flange has a platform so that the lip rests on the platform. There may be at least one pedestal in the second region, or none. The assembly may have leads with inboard end portions embedded along a length of a lip wall and extending to an upper surface of the lip to permit attachment of connections to die on the flange.

The following example and test results are intended to illustrate some of the many improvements that the embodiments may provide, but does not limit either the scope of the invention, or the benefits thereof.

EXAMPLE

Figure 11:
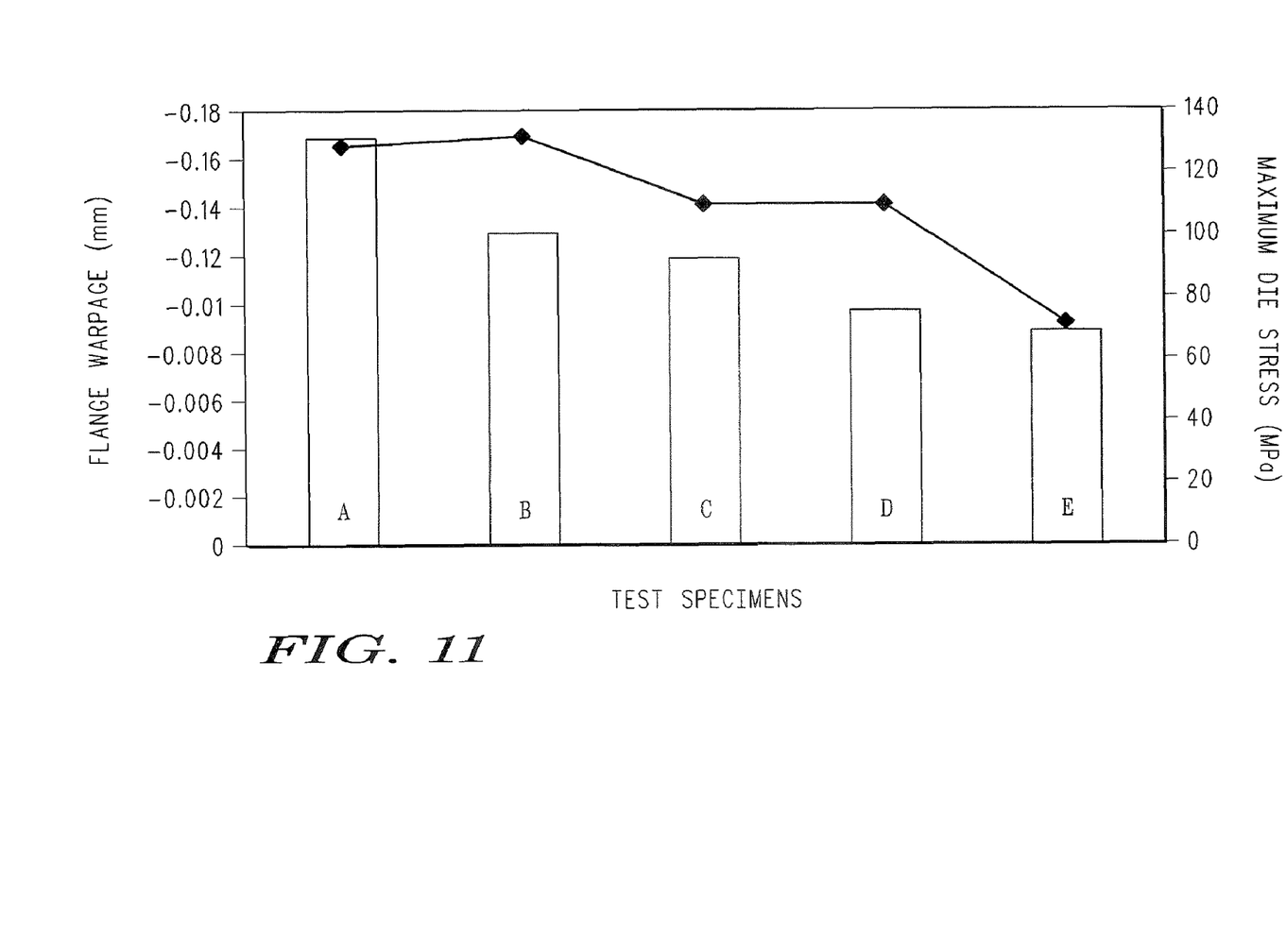
FIG. 11 is a graphical representation of the improvement in flange stiffness over a control achieved in accordance with embodiments of the invention, for particular lip and pedestal configurations and under specified conditions.

Tests were conducted to quantify the improvement in stiffness (resistance to warpage from heat-induced stress) of flanges made according to the invention as compared to a control without any stiffening structure. The flanges were all made of copper and 100 mil thick. In these tests the following were compared:

A. A 100 mil thick flange as control
B. A 100 mil thick flange with a 21 mil height frame
C. A 100 mil thick flange with one 21 mil raised pedestal (no frame)
D. A 100 mil thick flange with 21 mil height frame and one 21 mil thick pedestal
E. A 100 mil thick flange with 21 mil height frame and six 21 mil thick die stands Each flange was measured for planarity to eliminate any that had inherent warpage. Testing was then conducted according to the following: the flanges were each heated to 380 degrees Centigrade for die attachment. Twelve die were attached to each flange, and each was then cooled to room temperature at approximately the same rate. After cooling, each flange was measured from center to edge for extent of warpage. The results are graphically illustrated in FIG. 11, with reference to the alphabetic designations, above, for each flange. As can be seen, each of the frame-bearing stiffened flanges (B, D, and E) had less warpage than the control flange A. Further, the flanges that had both frame and raised pedestal (D, E) had less warpage than those with only a frame (B). Finally, the flange with frame and multiple pedestals E had the best result (lowest warpage).

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A die assembly comprising:
   a flange having a first flange surface, a second flange surface opposed to the first flange surface, and flange sidewalls extending between the first flange surface and the second flange surface;
   lip walls having first lip surfaces, second lip surfaces opposed to the first lip surfaces, and lip sidewalls extending between the first lip surfaces and the second lip surfaces, wherein the lip sidewalls are positioned adjacent to the flange sidewalls;
   at least one die mounted over the first flange surface; and
   leads for electrical contact with the at least one die, wherein the leads have inboard end portions and outboard end portions, and the leads are configured to preserve a seating plane, the seating plane spaced apart from a plane of the second flange surface, wherein the inboard end portions of the leads are embedded in the lip walls, and the inboard end portions extend from the seating plane upward through the lip walls toward the first lip surfaces, and the outboard end portions are aligned substantially within the seating plane.

2. The die assembly of claim 1, wherein the first lip surfaces are raised with respect to the first flange surface.

3. The die assembly of claim 2, wherein the lip walls are formed from a material selected from a group consisting of a ceramic material and a polymeric material.

4. The die assembly of claim 1, wherein the lip walls are formed from a nonconductive material.

5. The die assembly of claim 1, wherein the leads are isolated electrically from the lip walls by a coating or intermediate layer of a nonconductive material.

6. The die assembly of claim 1, wherein the flange includes a platform on a perimeter of the flange and having a first platform surface, and the second lip surfaces are positioned adjacent to the first platform surface.

7. The die assembly of claim 1, further including one or more pedestals on the first flange surface, wherein the at least one die are mounted on the one or more pedestals.

8. The die assembly of claim 1, wherein the inboard end portions are exposed on the first lip surface for attachment of connecting leads to the at least one die.

9. The die assembly of claim 1, wherein the lip walls are configured to impart stiffness to the flange, the stiffness sufficient to at least partially counteract thermally-induced stresses generated from coefficient of thermal expansion differentials between the flange and the at least one die during an elevated temperature die attachment process.

10. The die assembly of claim 1, wherein a thickness of the flange between the first and second flange surfaces is about 65 mils or greater.

11. The die assembly of claim 10, wherein the thickness of the flange is in a range of about 65 to 100 mils.

12. A die assembly comprising:
a flange having a first flange surface, a second flange surface opposed to the first flange surface, and flange sidewalls extending between the first flange surface and the second flange surface, wherein the first flange surface is adapted to receive at least one die;
a lip extending from the first flange surface, the lip configured to impart stiffness to the flange, the stiffness sufficient to at least partially counteract thermally-induced stresses generated from coefficient of thermal expansion differentials between the flange and the at least one die to be mounted thereon in an elevated temperature die attachment process;
the at least one die mounted over the first flange surface; and
leads for electrical contact with the at least one die, the leads configured to preserve a seating plane, the seating plane spaced from a plane of the second flange surface, wherein the leads are embedded in an organic composition and the leads extend from raised inboard end portions nearest the at least one die to lower outboard end portions aligned substantially within the seating plane.

13. The die assembly of claim 12, wherein the lip has a first lip surface, a second lip surface opposed to the first lip surface, and a lip sidewall extending between the first and second lip surfaces, and wherein the lip is formed from the organic composition, the lip sidewall is positioned adjacent to a flange sidewall, and the leads are embedded in the organic composition of the lip.

14. The die assembly of claim 13, wherein the flange includes a platform on a perimeter of the flange and having a first platform surface, and the second lip surface is positioned adjacent to the first platform surface.

15. The die assembly of claim 13, wherein the inboard end portions are exposed on the first lip surface for attachment of connecting leads to the at least one die.

16. The die assembly of claim 12, further including one or more pedestals on the first flange surface, wherein the at least one die are mounted on the one or more pedestals.

17. A die assembly comprising:
a flange having a first flange surface, a second flange surface opposed to the first flange surface, and flange sidewalls extending between the first flange surface and the second flange surface, wherein the first flange surface is adapted to receive at least one die;
a lip extending from the first flange surface and having an upper surface and a lip wall, the lip configured to impart stiffness to the flange, the stiffness sufficient to at least partially counteract thermally-induced stresses generated from coefficient of thermal expansion differentials between the flange and the at least one die to be mounted thereon in an elevated temperature die attachment process; and
leads having inboard end portions embedded along a length of the lip wall and extending to the upper surface of the lip to permit attachment of connections to die on the flange.

18. The die assembly of claim 17, wherein the flange has thickness between the first and second flange surfaces in a range from about 65 to about 100 mils.

19. The die assembly of claim 17, wherein the lip extends along a flange sidewall and the lip extends upward above the first flange surface.

20. The die assembly of claim 17, wherein the flange comprises a platform, and the lip extends along a flange sidewall and rests on the platform.

* * * * *